(12) United States Patent
Chen et al.

(10) Patent No.: US 9,865,609 B2
(45) Date of Patent: Jan. 9, 2018

(54) ONE-TIME-PROGRAMMING (OTP) MEMORY CELL WITH FLOATING GATE SHIELDING

(71) Applicant: Taiwan Semiconductor Manufacturing Co., Ltd., Hsin-Chu (TW)

(72) Inventors: Hung-Lin Chen, Pingtung (TW); Shyh-Wei Cheng, Zhudong Township (TW); Che-Jung Chu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/008,748

(22) Filed: Jan. 28, 2016

(65) Prior Publication Data
US 2017/0221910 A1    Aug. 3, 2017

(51) Int. Cl.
*H01L 27/115* (2017.01)
*H01L 21/28* (2006.01)
*H01L 27/11521* (2017.01)
*G11C 16/04* (2006.01)

(52) U.S. Cl.
CPC .... H01L 27/11521 (2013.01); G11C 16/0433 (2013.01); H01L 21/28273 (2013.01)

(58) Field of Classification Search
CPC .............. H01L 27/11521; H01L 21/28273
See application file for complete search history.

(56) References Cited

U.S. PATENT DOCUMENTS

| | | | |
|---|---|---|---|
| 5,867,429 A * | 2/1999 | Chen | G11C 11/5621 257/E21.682 |
| 7,339,229 B2 | 4/2008 | Wang et al. | |
| 2004/0012998 A1* | 1/2004 | Chien | H01L 27/11524 365/185.2 |
| 2004/0150110 A1* | 8/2004 | Usami | H01L 21/3148 257/756 |
| 2006/0208309 A1* | 9/2006 | Forbes | H01L 27/11521 257/315 |
| 2007/0114629 A1* | 5/2007 | Dosluoglu | H01L 27/14609 257/435 |
| 2011/0084391 A1 | 4/2011 | Cheng et al. | |
| 2014/0098591 A1 | 4/2014 | Chen et al. | |
| 2017/0005103 A1* | 1/2017 | Zhang | H01L 27/11233 |

* cited by examiner

*Primary Examiner* — Thanh V Pham
(74) *Attorney, Agent, or Firm* — Eschweiler & Potashnik, LLC

(57) ABSTRACT

A one-time programmable (OTP) memory cell with floating gate shielding is provided. A pair of transistors is arranged on a semiconductor substrate and electrically coupled in series, where the transistors comprise a floating gate. An interconnect structure overlies the pair of transistors. A shield is arranged in the interconnect structure, directly over the floating gate. The shield is configured to block ions in the interconnect structure from moving to the floating gate. A method for manufacturing an OTP memory cell with floating gate shielding is also provided.

20 Claims, 10 Drawing Sheets

ONE-TIME-PROGRAMMING (OTP) MEMORY CELL WITH FLOATING GATE SHIELDING

BACKGROUND

Many modern day electronic devices include electronic memory. Electronic memory is a device configured to store bits of data in respective memory cells. A memory cell is a circuit configured to store a bit of data, typically using one or more transistors. One type of electronic memory is one-time programmable (OTP) memory. OTP memory is read-only memory that may only be programmed (e.g., written to) once.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
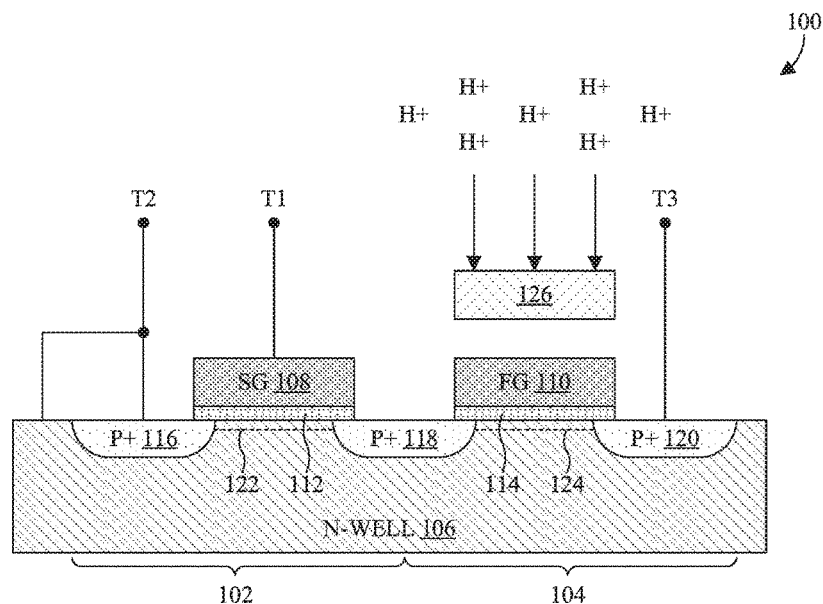
FIG. 1 illustrates a cross-sectional view of some embodiments of a one-time programmable (OTP) memory cell with floating gate shielding.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some one-time programming (OTP) memory cells comprise a pair of p-type metal-oxide-semiconductor (MOS) transistors connected in series. The pair comprises a select MOS transistor with a select gate, and further comprises a storage MOS transistor with a floating gate. The floating gate is configured to store a bit of data, the value of which depends upon the amount of charge stored by the floating gate. The select gate is configured to prevent charge from leaking out of the floating gate.

A challenge with the OTP memory cells is device mismatch (i.e., performance variation or mismatch). For example, when the OTP memory cells are manufactured in bulk, the performance of the OTP memory cells may vary within memory cell arrays and/or between integrated circuit (IC) dies. While the storage transistor is more tolerant of such performance variation, the select transistor is not. A cause for device mismatch is dangling bonds on semiconductor substrates of the OTP memory cells, such that terminating the dangling bonds may reduce device mismatch. An approach for terminating the dangling bonds is to perform a hydrogen alloy process in which the IC dies are annealed at high temperatures and in the presence of a hydrogen-containing gas. The hydrogen alloy process introduces hydrogen ions into the semiconductor substrates, which terminate the dangling bonds. However, the hydrogen alloy process also introduces hydrogen ions to the floating gate.

While performing the hydrogen alloy process, hydrogen ions move to the floating gate and neutralize charge stored in the floating gate. The extent of the neutralization is dependent upon the length, the temperature, and the hydrogen concentration of the hydrogen alloy process. By neutralizing charge stored in the floating gate, the reliability of the OTP memory cells is reduced and the bit of data is possibly corrupted.

The present application is directed to an OTP memory cell with floating gate shielding. In some embodiments, the OTP memory cell comprises a pair of transistors arranged on a semiconductor substrate and connected in series. A select transistor of the pair comprises a select gate, and a storage transistor of the pair comprises a floating gate. Conductive features are arranged in layers that are stacked over the pair in an interconnect structure of the OTP memory cell. At least one of the conductive features directly overlies the floating gate and shields the floating gate from ions. Advantageously, shielding the floating gate from ions results in good data retention and reliability of the OTP memory cell. Further, the shield can advantageously be formed without extra semiconductor manufacturing processes and/or cost.

With reference to FIG. 1, a cross-sectional view 100 of some embodiments of an OTP memory cell with floating gate shielding is provided. As illustrated, a select transistor 102 and a storage transistor 104 are arranged on one or more respective body regions 106, and are connected in series. Respective gates 108, 110 of the select and storage transistors 102, 104 are laterally spaced from one another and isolated from the body region(s) 106 by respective insulating layers 112, 114. A select gate 108 of the select transistor 102 is electrically coupled to a first terminal T1 of the OTP memory cell, and a floating gate 110 of the storage transistor 104 is configured to store a bit of data. Depending upon the amount of charge stored on the floating gate 110, the bit is either a logical "1" or a logical "0".

Respective source/drain regions 116, 118, 120 of the select and storage transistors 102, 104 are arranged in the body region(s) 106, on opposing sides of the gates 108, 110. Further, the source/drain regions 116, 118, 120 define respective channel regions 122, 124 of the select and storage transistors 102, 104, underlying the select and floating gates 108, 110 of the select and storage transistors 102, 104. A source/drain region 116 individual to the select transistor 102 and, in some embodiments, the body region(s) 106 are electrically coupled to a second terminal T2 of the OTP memory cell. A source/drain region 120 individual to the storage transistor 104 is electrically coupled to a third terminal T3 of the OTP memory cell.

A shield 126 is arranged directly over the floating gate 110, and partially or fully covers the floating gate 110. In some embodiments, a footprint of the shield 126 has a size (e.g., in terms of area, width, length, etc.) that is less than or equal to that of the floating gate 126. Further, in some embodiments, the shield and the floating gate 126 share a common footprint. The shield 126 comprises one or more features (not individually shown) distributed amongst one or more heights above the floating gate 110. For example, the shield 126 may be restricted to a single feature and a single height above the floating gate 110. As another example, the shield 126 may comprise a first feature covering about ¼ of the floating gate 110 at a first height, and a second feature covering about ¾ of the floating gate 110 at a second height. In some embodiments, the feature(s) correspond to lines, pads, vias, and/or other conductive features of an interconnect structure overlying the floating gate 110.

Advantageously, the shield 126 prevents ions, such as hydrogen ions H+, from diffusing or otherwise moving through overlying layers to the floating gate 110 and negating charge stored by the floating gate 110. Such ions may stem from, for example, process gases used to form the overlying layers and/or from a hydrogen alloy process used to reduce device mismatch. By preventing the ions from diffusing or otherwise moving to the floating gate 110, the OTP memory cell may achieve good data retention and high reliability. Further, in embodiments where the features of the shield 126 correspond to conductive features of the BEOL region, the shield 126 may advantageously be formed without extra semiconductor manufacturing processes and/or cost.

In some embodiments, the OTP memory cell is one of multiple OTP memory cells arranged in rows and columns (i.e., a memory cell array). In some of such embodiments, the first terminal T1 may be connected to a word line shared by OTP memory cells in the row of the OTP memory cell. Further, the second and third terminals T2, T3 may be respectively connected to a source line and a bit line shared by OTP memory cells in the column of the OTP memory cell. Alternatively, the second and third terminals T2, T3 may be respectively connected to the bit line and the source line.

Figure 2A:
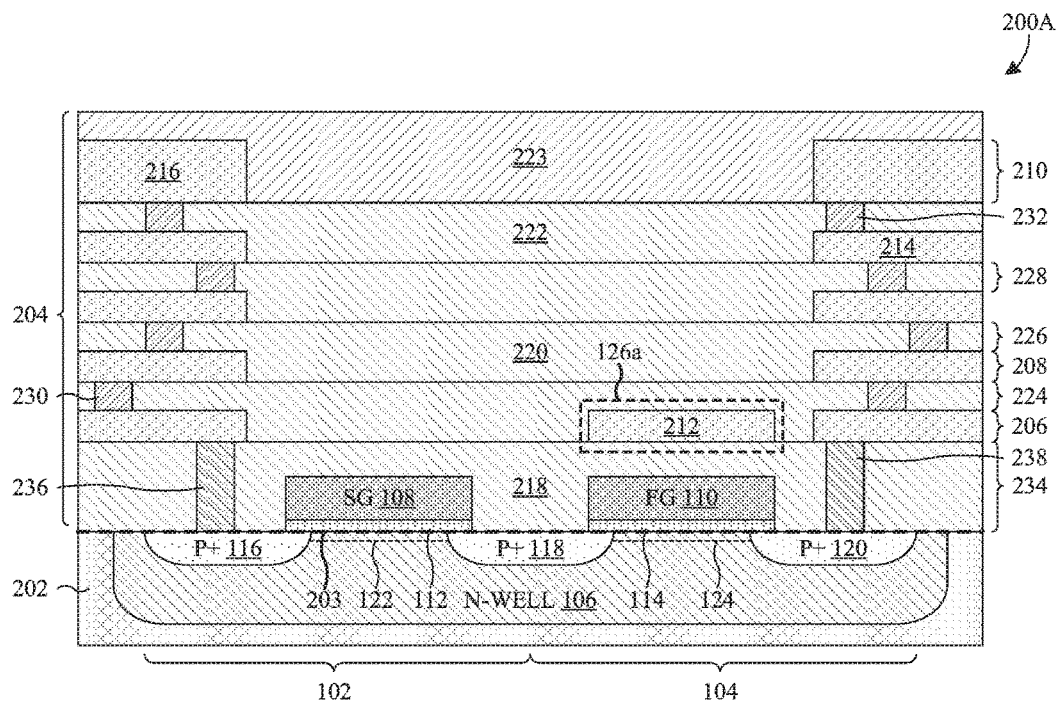
FIGS. 2A-2E illustrate cross-sectional views of more detailed embodiments of the OTP memory cell of FIG. 1.

With reference to FIG. 2A, a cross-sectional view 200A of more detailed embodiments of the OTP memory cell of FIG. 1 is provided. As illustrated, a select transistor 102 and a storage transistor 104 are arranged on one or more respective body regions 106, and are connected in series. In some embodiments, the select and storage transistors 102, 104 are MOS transistors. Further, in some embodiments, the select and storage transistors 102, 104 are p-type transistors. The body region(s) 106 are semiconductor regions each doped with n- or p-type dopants of an opposite type as respective transistors 102, 104. In some embodiments, the body region(s) 106 are restricted to a single body region that is an n-well arranged in a semiconductor substrate 202. In other embodiments, the body region(s) 106 are restricted to a single body region that is the bulk of the semiconductor substrate 202. Further, in some embodiments, an upper surface of the body region(s) 106 and/or the semiconductor substrate 202 may comprise dangling bonds 203 that are terminated by hydrogen ions. The semiconductor substrate 202 may comprise, for example, a bulk silicon substrate.

Respective gates 108, 110 of the select and storage transistors 102, 104 are laterally spaced from one another and isolated from the body region(s) 106 by respective insulating layers 112, 114 arranged under the gates 108, 110. A floating gate 110 of the storage transistor 104 is configured to store a bit of data. Depending upon the amount of charge stored on the floating gate 110, the bit is either a logical "1" or a logical "0". A select gate 108 of the select transistor 102 is configured to select the OTP memory cell for readout and/or to prevent leakage of charge from the floating gate 110. The gates 108, 110 may be, for example, doped polysilicon, metal, or some other conductive material. The insulating layers 112, 114 may be, for example, an oxide, such as silicon dioxide, a high κ dielectric (i.e., a dielectric with a dielectric constant greater than about 3.9), or some other dielectric.

Respective source/drain regions 116, 118, 120 of the select and storage transistors 102, 104 are arranged in the body region(s) 106, on opposing sides of the gates 108, 110, and define respective channel regions 122, 124 of the select and storage transistors 102, 104. The source/drain regions 116, 118, 120 are doped with n- or p-type dopants of an opposite type as dopants in respective body region(s) 106. In some embodiments, the source/drain regions 116, 118, 120 comprise source/drain regions 116, 120 individual to the select and storage transistors 102, 104 and a source/drain region 118 common to the select and storage transistors 102, 104. The channel regions 122, 124 are configure to selectively conduct depending upon a bias and/or charge on the gates 108, 110.

In operation, the OTP memory cell is programmed (i.e., charge is added to the floating gate 110) by applying a first voltage across the select and storage transistors 102, 104, while the select gate 108 is biased to allow the channel region 122 of the select transistor 102 to conduct. Carriers move within the channel region 122 of the select transistor 102 to the channel region 124 of the storage transistor 104, where the carriers undergo hot-carrier injection from the channel region 124 of the storage transistor 104 to the floating gate 110. The carriers then become trapped in the floating gate 110 to program the OTP memory cell. Similar to programming the OTP memory cell, the OTP memory cell is read by applying a second voltage across the select and storage transistors 102, 104, while the select gate 108 is biased to allow the select transistor 102 to conduct. Depending upon whether the channel region 124 of the storage transistor 104 conducts, the OTP memory cell stores a logical "1" or "0".

An interconnect structure 204 is arranged over the select and storage transistors 102, 104. The interconnect structure 204 comprises a plurality of interconnect layers 206, 208, 210 (e.g., metallization layers) stacked upon one another (only some of which are labeled). For example, the interconnect structure 204 may comprise 10 interconnect layers. The interconnect layers 206, 208, 210 comprise respective features 212, 214, 216, such as line features and/or pad features. For ease of illustration, only some of the features 212, 214, 216 are labeled. In some embodiments, a topmost interconnect layer 210 comprises pad features, and underlying interconnect layers 206, 208 are restricted to line features. The interconnect layers 206, 208, 210 may be, for example, a metal, such as copper, or some other conductive material.

Interlayer dielectric (ILD) layers 218, 220, 222 (only some of which are labeled) are arranged between the interconnect layers 206, 208, 210, and between the select and storage transistors 102, 104 and a bottommost interconnect layer 206. Further, a passivation layer 223 covers the ILD layers 218, 220, 222 and the interconnect layers 206, 208, 210. The ILD layers 218, 220, 222 may be, for example, an oxide, a low κ dielectric (i.e., a dielectric with a dielectric constant less than about 3.9), or some other dielectric. The passivation layer 223 may be, for example, an oxide, a nitride, such as silicon nitride, or some other dielectric.

Via layers 224, 226, 228 (only some of which are labeled) are arranged in the ILD layers 218, 220, 222, between the interconnect layers 206, 208, 210. The via layers 224, 226, 228 comprise respective via features 230, 232 (only some of which are labeled) extending through the ILD layers 218, 220, 222 to electrically couple neighboring interconnect layers 206, 208, 210. Further, a contact layer 234 is arranged in a bottommost ILD layer 218 between the bottommost interconnect layer 206 and the select and storage transistors 102, 104. The contact layer 234 comprises contact features 236, 238 extending through the bottommost interconnect layer 206 to electrically couple the select and storage transistors 102, 104 to the bottommost interconnect layer 206. The via and contact layers 224, 226, 228, 234 may be, for example, a metal, such as copper or tungsten, or some other conductive material.

A shield 126a is arranged is arranged directly over the floating gate 110 to partially or fully cover the floating gate 110. The shield 126a is configured to block the diffusion or movement of ions, such as hydrogen ions, through overlying layers, and/or is configured to absorb and trap ions. The shield 126a may comprise one or more features 212 of the interconnect layers 206, 208, 210 and/or of the via layers 224, 226, 228, each feature, in some embodiments, directly overlying the floating gate 110. For example, the shield 126a may comprise a single feature 212, such as a single line feature, of the interconnect layers 206, 208, 210 that is arranged directly over the floating gate 110. While the single feature 212 is illustrated at the bottommost interconnect layer 206, the single feature 212 may be arranged at other interconnect layers 208, 210 in other embodiments. The feature(s) 212 of the shield 126a may, for example, individually comprise one or more of aluminum, copper, titanium nitride, tantalum, tantalum nitride, a metal alloy, and/or materials configured to trap ions. In some embodiments, a region of the interconnect structure 204 arranged laterally between source/drain regions 116, 120 individual to the select and storage transistors 102, 104 is devoid of conductive features, except for those of the shield 126a.

With reference to FIGS. 2B-2E, cross-sectional views 200B-200E of other embodiments of the OTP memory cell of FIG. 2A are provided. For these other embodiments, assume that the interconnect layers 206, 208, 210 have respective numerical designations increasing from 1 at the bottommost interconnect layer 206 to N at the topmost interconnect layer 210, where N is the number of interconnect layers. For example, a first interconnect layer is the bottommost interconnect layer 206 and a second interconnect layer 208 is an interconnect layer immediately above the bottommost interconnect layer 206. Similarly, assume that the via layers 224, 226, 228 have respective numerical designations increasing from 1 at a bottommost via layer 224 to M at a topmost via layer (not labeled), where M is the number of via layers.

Figure 2B:
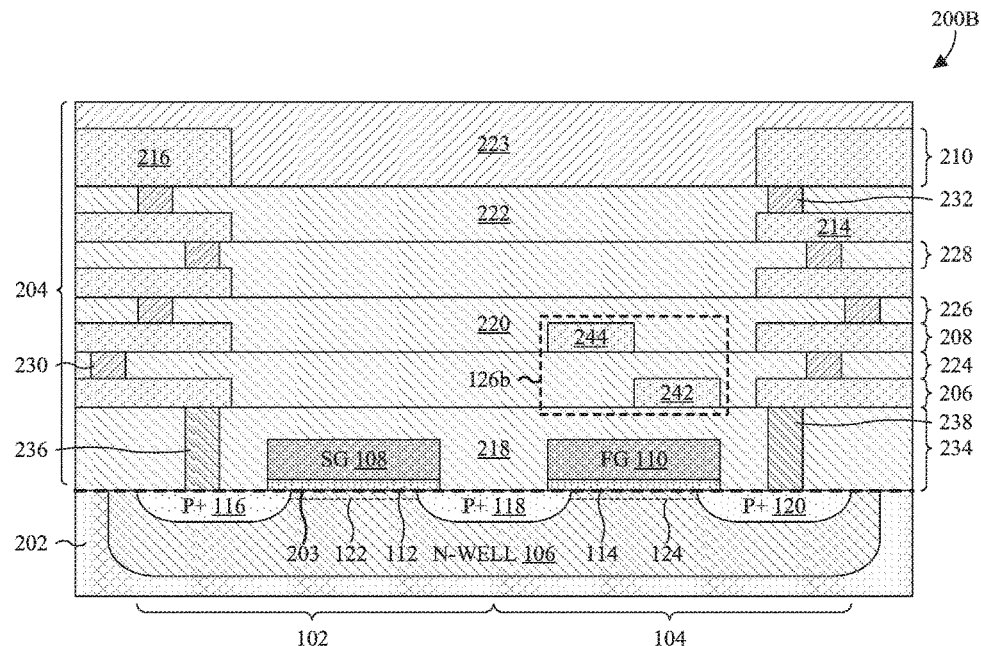

As illustrated by the cross-sectional view 200B of FIG. 2B, a shield 126b comprises a pair of features 242, 244, such as line features, that are distributed amongst the first and second interconnect layers 206, 208. The features 242, 244 individually cover about half of the floating gate 110, and collectively cover the entirety of the floating gate 110, to prevent ions from reaching the floating gate 110.

While the shield 126b is illustrated with features 242, 244 of the first and second interconnect layers 206, 208, other embodiments of the shield 126b may include features of additional and/or alternative interconnect layers 210. For example, the shield 126b may additionally comprise a feature of a third interconnect layer (not labeled). As another example, the shield 126b may comprise features of the second and third interconnect layers 208, but not features of the first interconnect layer 206. As yet another example, the shield 126b may comprise features of the first and third interconnect layers 206, but not features of the second interconnect layer 208. Further, while the shield 126b is illustrated with features 242, 244 individually covering about half of the floating gate 110, other embodiments of the shield 126b may comprise features individually covering different ratios and/or percentages of the floating gate 110. For example, a first feature may cover about ¼ of the floating gate 110, while a second feature may cover about ¾ of the floating gate 110.

Figure 2C:
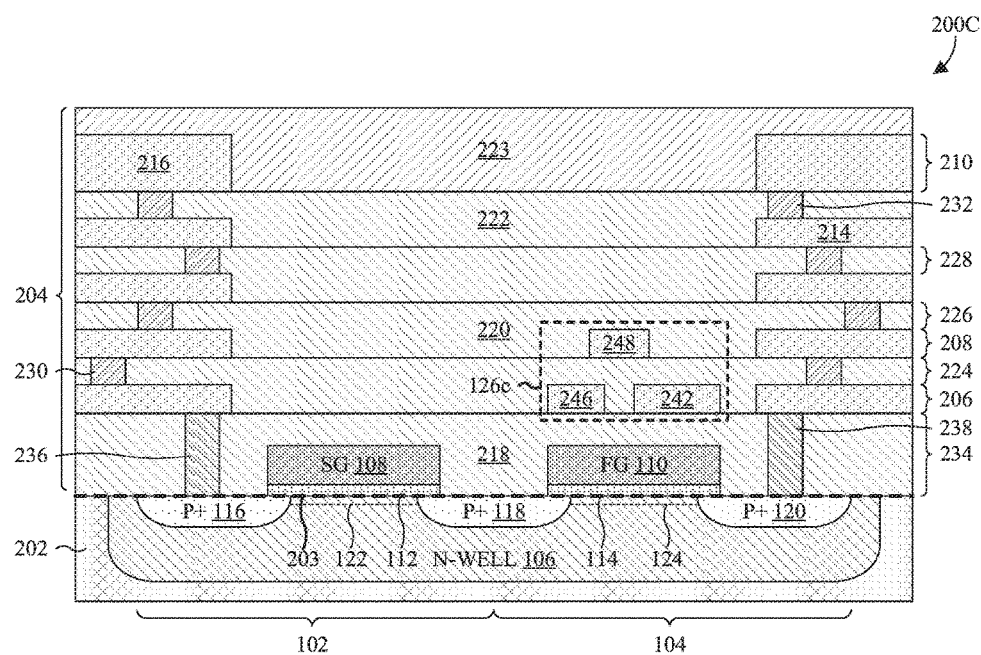

As illustrated by the cross-sectional view 200C of FIG. 2C, a shield 126c is distributed amongst the first and second interconnect layers 206, 208. Further, the shield 126c comprises multiple features 242, 246 of the first interconnect layer 206 and a single feature 248 of the second interconnect layer 208. The features 242, 244, 248 of the shield 126c individually cover part of the floating gate 110, and collectively cover the entirety of the floating gate 110.

While the shield 126c is illustrated with features 242, 244, 248 of the first and second interconnect layers 206, 208, other embodiments of the shield 126c may comprise features of additional and/or alternative interconnect layers 210. Further, while the shield 126c is illustrated with one or two features per interconnect layer, other embodiments of the shield 126c may comprise more or less features per interconnect layer. For example, the shield 126c may comprise three features of an interconnect layer.

Figure 2D:
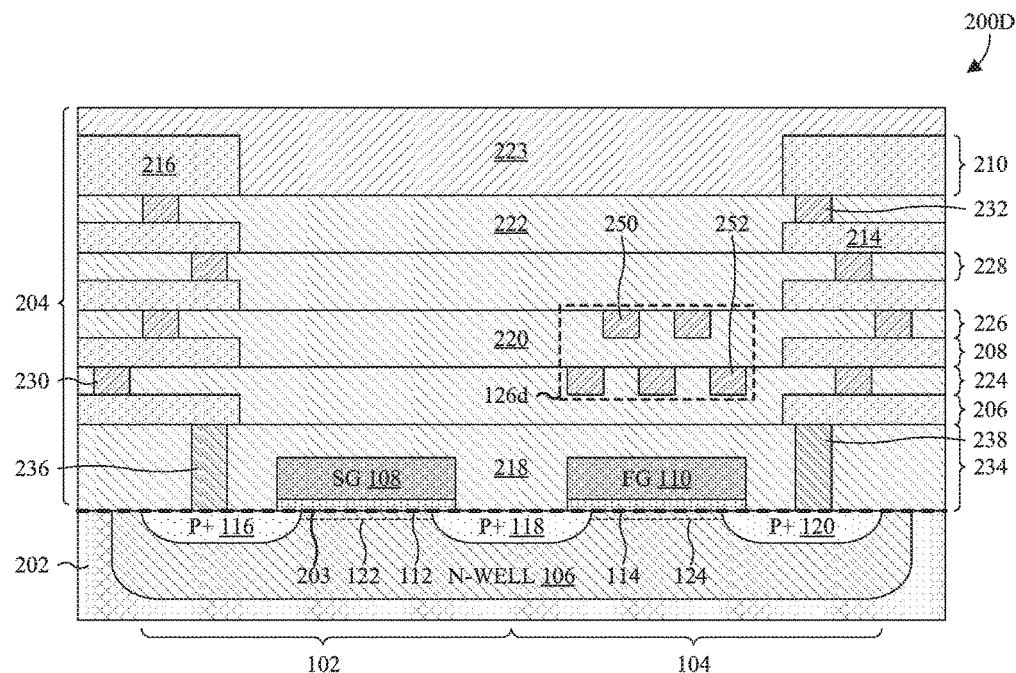

As illustrated by the cross-sectional view 200D of FIG. 2D, a shield 126d is distributed amongst first and second via layers 224, 226. Further, the shield 126d comprises multiple features 250, 252 (only some of which are labeled) of the first and second via layers 224, 226. The features 250, 252 individually cover about a fifth of the floating gate 110, and collectively cover the entirety of the floating gate 110.

While the shield 126d is illustrated with features 250, 252 of the first and second via layers 224, 226, other embodiments of the shield 126c may comprise features of additional and/or alternative via layers 228. Further, while the shield 126d is illustrated with features 250, 252 from multiple via layers, other embodiments of the shield 126d may be restricted to one or more features of a single via layer.

Figure 2E:
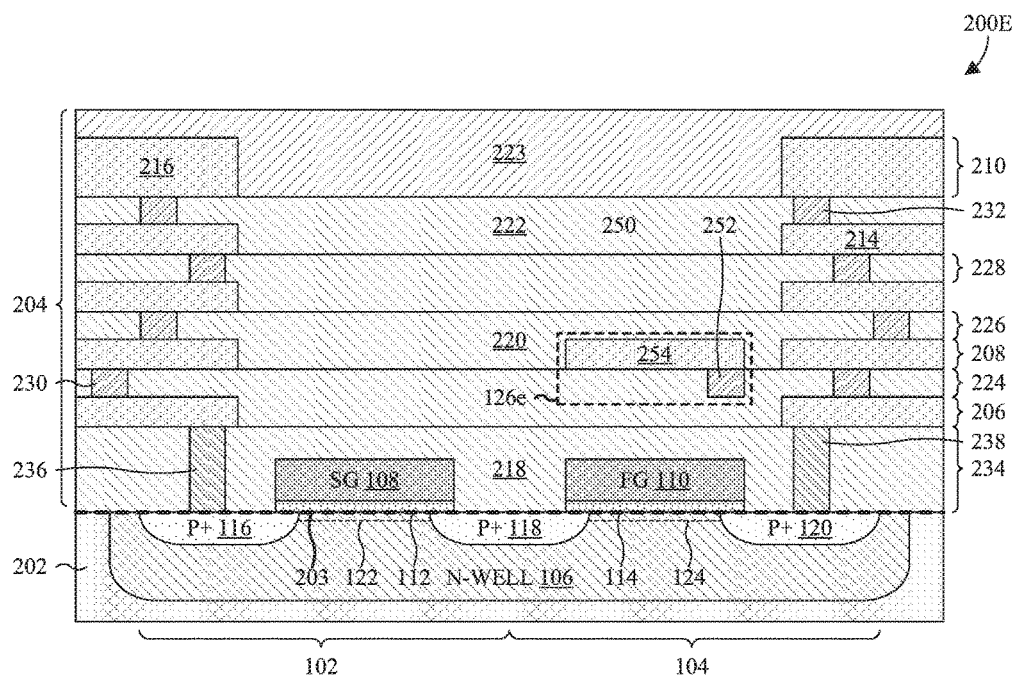

As illustrated by the cross-sectional view 200E of FIG. 2E, a shield 126e comprises a feature 252 of the first via layer 224, as well as a feature 254 of the second interconnect layer 208. The feature 252 of the first via layer 224, 226 individually covers about a fifth of the floating gate 110, and the feature 254 of the second interconnect layer 208 individually covers the majority of the floating gate 110. Collectively, the features 252, 254 cover a majority of the floating gate 110.

While the shield 126e is illustrated with a single feature 252 of the first via layer 224, other embodiments of the shield 126e may include more features of the first via layer 224. Similarly, while the shield 126e is illustrated with a single feature of the second interconnect layer 208, other embodiments of the shield 126e may include more features of the second interconnect layer 208. Moreover, while the shield 126e is illustrated spanning a single interconnect layer and a single via layer, other embodiments of the shield 126e may span more interconnect layers and/or more via layers.

With reference to FIGS. 3-8, 9A, 9B, and 10-13, a series of cross-sectional views of some embodiments of a method for manufacturing an OTP memory cell with floating gate shielding is provided. The cross-sectional views are applied to the embodiments of FIG. 2A, but are equally amenable to the embodiments of FIGS. 2B-2E.

Figure 3:
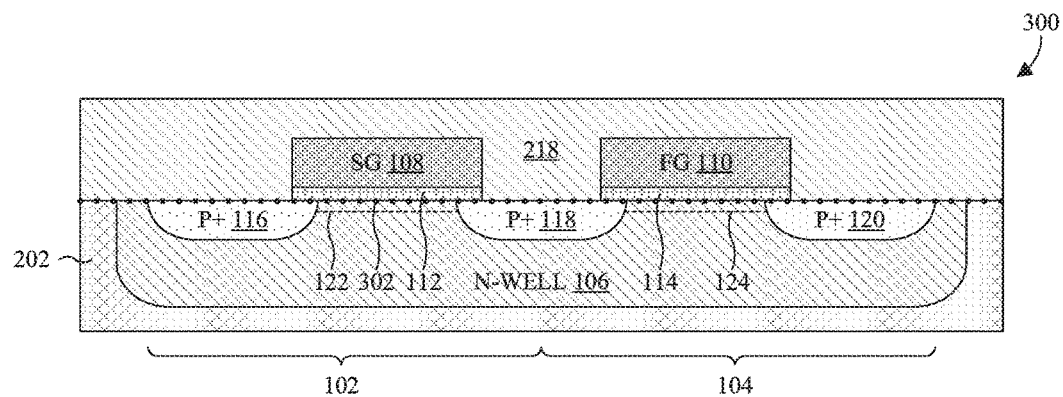
FIGS. 3-8, 9A, 9B, and 10-13 illustrate a series of cross-sectional views of some embodiments of a method for manufacturing an OTP memory cell with floating gate shielding.

As illustrated by the cross-sectional view 300 of FIG. 3, a select transistor 102 and a storage transistor 104 are formed over one or more respective body regions 106. The body region(s) 106 may, for example, be an n- or p-type well arranged in a semiconductor substrate 202, and/or a bulk of the semiconductor substrate 202. Forming the select and storage transistors 102, 104 comprises forming respective gates 108, 110 of the select and storage transistors 102, 104 laterally spaced from one another and isolated from the respective body region(s) 106 by respective insulating layers 112, 114. Further, forming the select and storage transistors 102, 104 comprises forming respective source/drain regions 116, 118, 120 of the select and storage transistors 102, 104 in the body region(s) 106, on opposing sides of the gates 108, 110, to define respective channel regions 122, 124 of the select and storage transistors 102, 104. In some embodiments, an upper surface of the body region(s) 106 and/or the semiconductor substrate 202 comprise dangling bonds 302 (illustrated by dots) that negatively affecting device performance and increase device mismatch.

Also illustrated by the cross-sectional view 300 of FIG. 3, a first ILD layer 218 is formed over the select and storage transistors 102, 104. In some embodiments, the process for forming the first ILD layer 218 comprises depositing a dielectric material over the select and storage transistors 102, 104. The dielectric material may, for example, be deposited by vapor deposition, such as, for example, chemical vapor deposition (CVD) and/or physical vapor deposition (PVD). Thereafter, a planarization, such as, for example, a chemical mechanical polish (CMP), is performed into the deposition to planarize an upper surface of the deposition.

Figure 4:
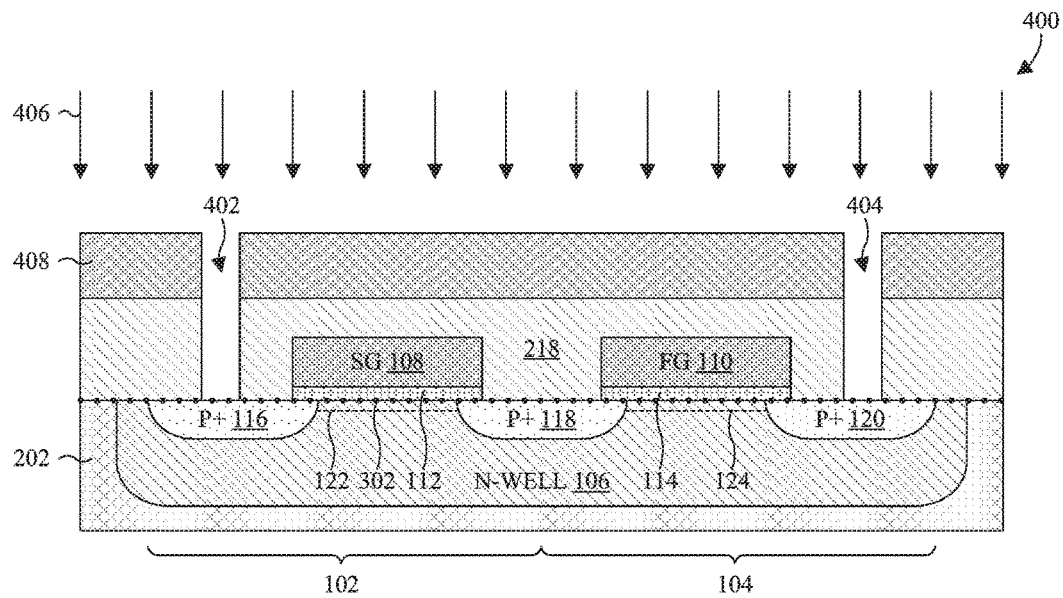

As illustrated by the cross-sectional view 400 of FIG. 4, contact openings 402, 404 are formed through the first ILD layer 218 to source/drain regions 116, 120 individual to the select and storage transistors 102, 104. Although not shown, in some embodiments, a contact opening is also formed to the select gate 108 and/or to the body region(s) 106.

In some embodiments, the process for forming the contact openings 402, 404 comprises depositing and patterning a photoresist layer over the first ILD layer 218. For example, the photoresist layer may be patterned to mask regions of the first ILD layer 218 that laterally surrounding the contact openings 402, 404. Thereafter, one or more etchants 406, such as wet or dry etchants, are applied to the first ILD layer 218 while using the patterned photoresist layer 408 as a mask. After forming the contact openings 402, 404, the patterned photoresist layer 408 is removed or otherwise stripped.

Figure 5:
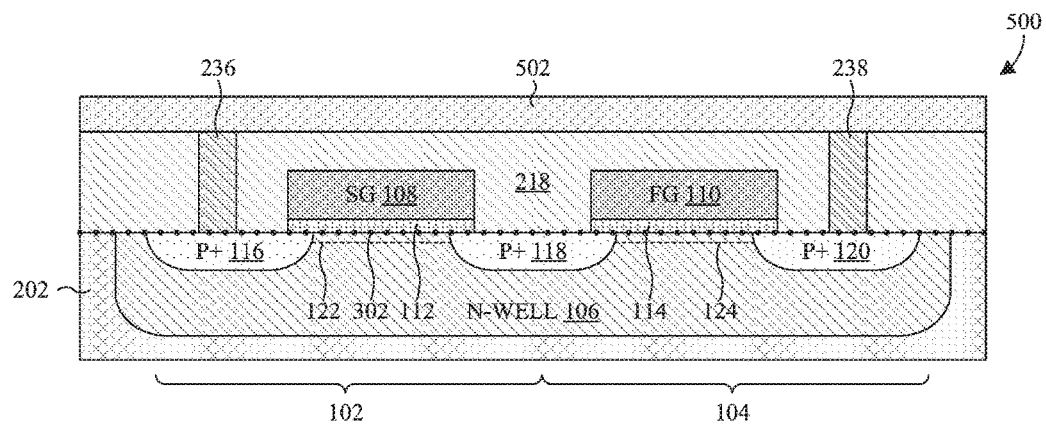

As illustrated by the cross-sectional view 500 of FIG. 5, the contact openings 402, 404 (see FIG. 4) are filled with a conductive material, such as tungsten, to form contact features 236, 238. In some embodiments, the process for filling the contact openings 402, 404 comprises the deposition of the conductive material in the contact openings 402, 404 and over the first ILD layer 218. Thereafter, a planarization and/or etch back is performed into the deposition until upper surfaces of the first ILD layer 218 and/or the deposition are coplanar. The planarization may, for example, be performed by a CMP.

Also illustrated, by the cross-sectional view 500 of FIG. 5, a first conductive layer 502 is formed over the first ILD layer 218 and the contact features 236, 238. The first conductive layer 502 may be formed by, for example, depositing a conductive material, such as, for example, copper. The deposition may, for example, be performed using, for example, vapor deposition or atomic layer deposition (ALD).

Figure 6:
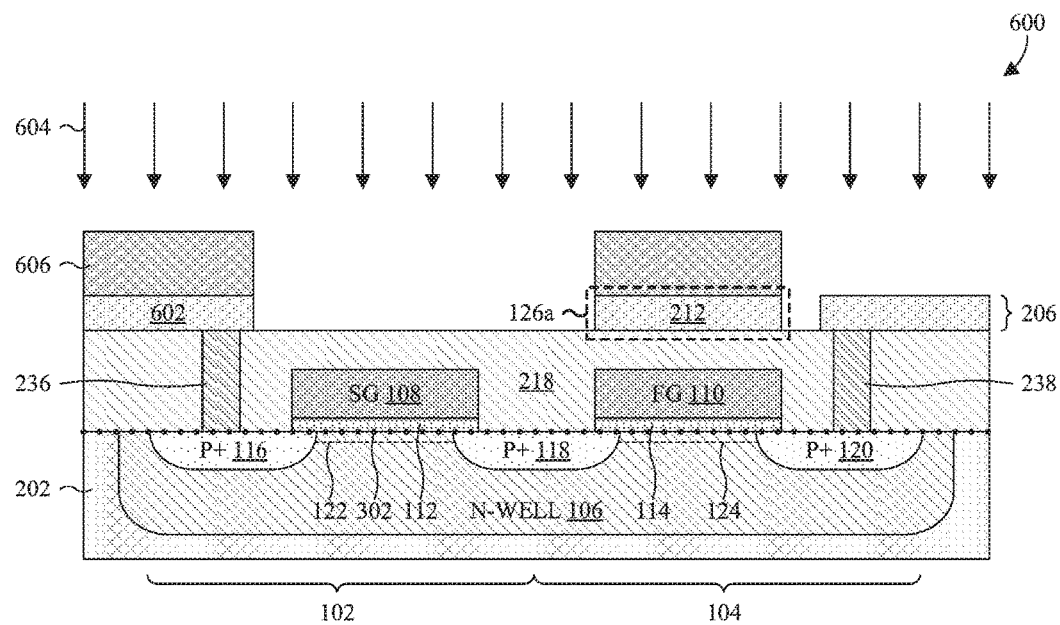

As illustrated by the cross-sectional view 600 of FIG. 6, the first conductive layer 502 (see FIG. 5) is patterned to form a first interconnect layer 206 and a shield 126a overlying the floating gate 110. The first interconnect layer 206 comprises a plurality of features 212, 602 (only some of which are labeled), such as line features or wire features. Some of the features 212, 602 abut and/or electrically couple with the contact features 236, 238, and one of the features 212, 602 directly overlies the floating gate 110 to define the shield 126a.

In some embodiments, the process for forming the first interconnect layer 206 and the shield 126a comprises depositing and patterning of a photoresist layer over the first conductive layer 502. For example, the photoresist layer may be patterned to mask regions of the first conductive layer 502 corresponding to the features 212 of the first interconnect layer 206. Thereafter, one or more etchants 604, such as wet or dry etchants, are applied to the first conductive layer 502 while using the patterned photoresist layer 606 as a mask. After patterning the first conductive layer 502, the patterned photoresist layer 606 is removed.

As described above, the shield 126a is formed simultaneous with the first interconnect layer 206. The same mask and etch process is used to form both the first interconnect layer 206 and the shield 126a. This advantageously allows the shield 126a to be formed without additional processes and/or without additional cost.

Figure 7:
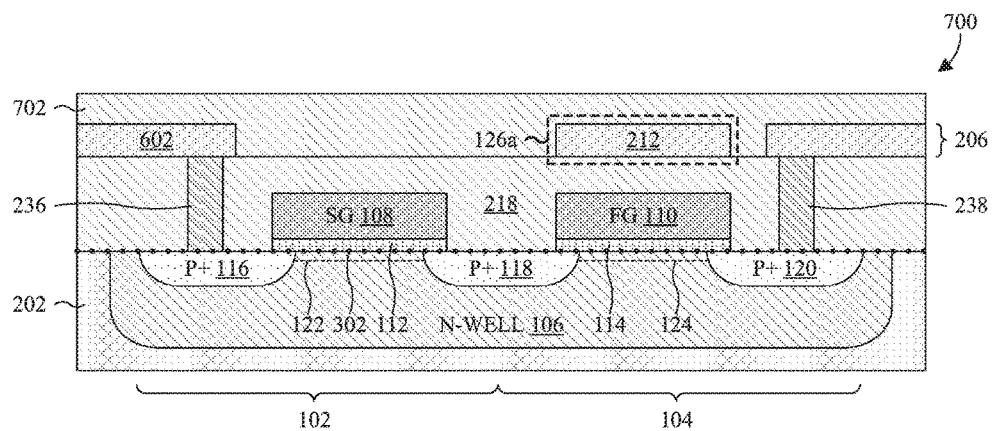

As illustrated by the cross-sectional view 700 of FIG. 7, a second ILD layer 702 is formed over the first ILD layer 218 and the first interconnect layer 206. In some embodiments, the process for forming the second ILD layer 702 comprises depositing a dielectric material over the first ILD layer 218 and the first interconnect layer 206. The dielectric layer may, for example, be deposited by vapor deposition. Thereafter, a planarization, such as, for example, a CMP, is performed into the deposition to planarize an upper surface of the deposition.

Figure 8:
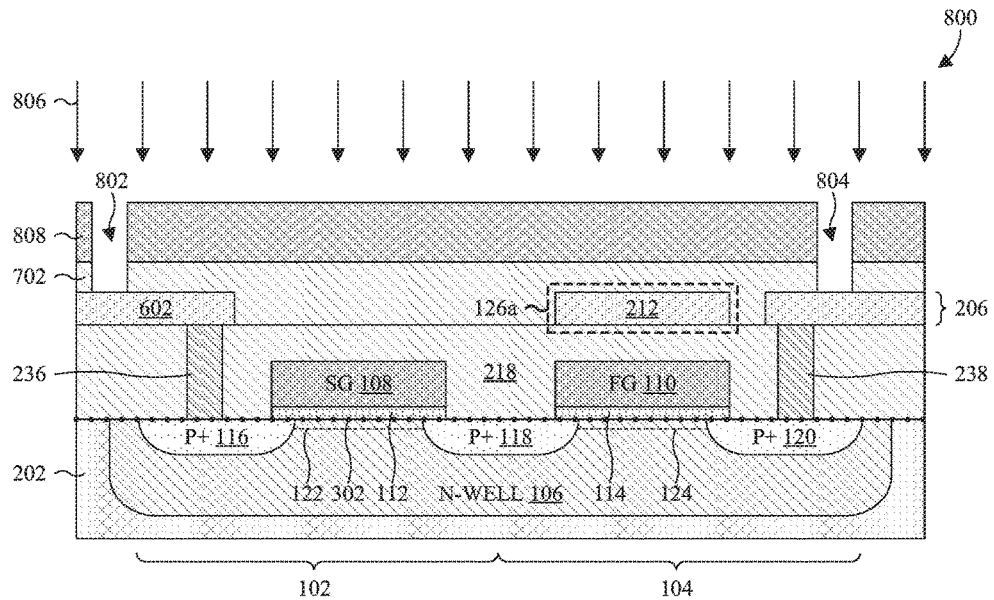

As illustrated by the cross-sectional view 800 of FIG. 8, via openings 802, 804 are formed through the second ILD layer 702 to the features 212 of the first interconnect layer 206. In some embodiments, the process for forming the via openings 802, 804 comprises depositing and patterning a photoresist layer over the second ILD layer 702. For example, the photoresist layer may be patterned to mask regions of the second ILD layer 702 that laterally surrounding the via openings 802, 804. Thereafter, one or more etchants 806, such as wet or dry etchants, are applied to the second ILD layer 702 while using the patterned photoresist layer 808 as a mask. After forming the via openings 802, 804, the patterned photoresist layer 808 is removed.

Figure 9A:
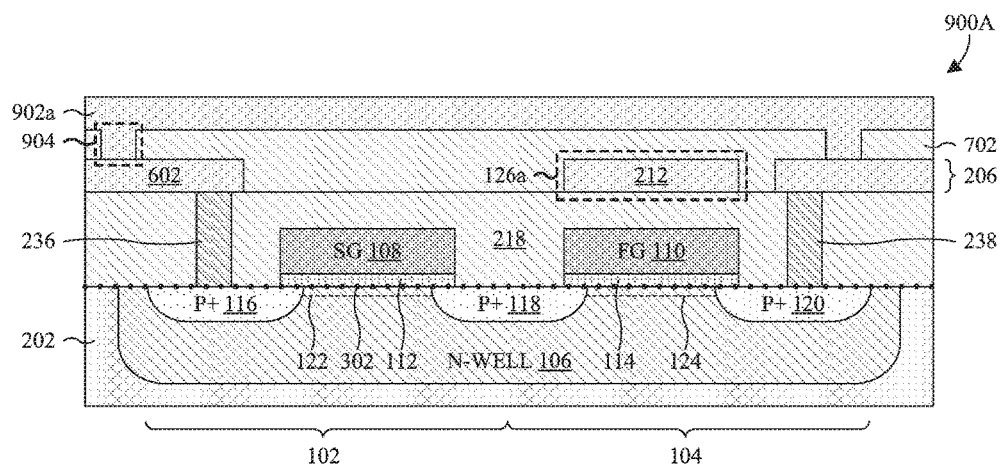

As illustrated by the cross-sectional view 900A of FIG. 9A, a second conductive layer 902a is formed over the second ILD layer 702 and filling the via openings 802, 804

(see FIG. 8). The second conductive layer 902a comprises via features 904 (only one of which is labeled) corresponding to regions of the second conductive layer 902a in the via openings 802, 804. In some embodiments, the process for forming the second conductive layer 902a comprises depositing a conductive material, such as, for example, copper, in the via openings 802, 804 and over the second ILD layer 702. Thereafter, a planarization is performed into the second conductive layer 902a to planarize an upper surface of the second conductive layer 902a.

Figure 9B:
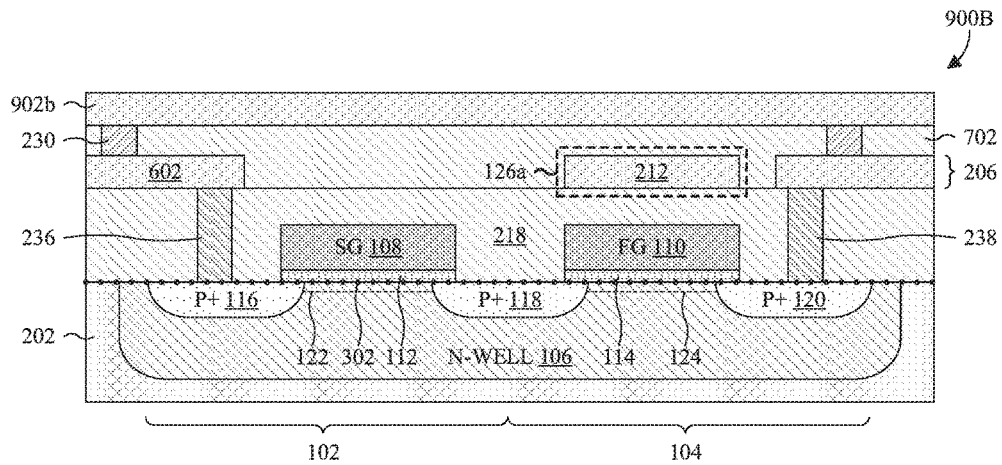

As illustrated by the cross-sectional view 900B of FIG. 9B, an alternative to the embodiments of FIG. 9A is provided. The via openings 802, 804 (see FIG. 8) are filled with a conductive material, such as aluminum copper, to form via features 230 (only one of which is labeled). In some embodiments, the process for filling the via openings 802, 804 comprises the deposition of the conductive material in the via openings 802, 804 and over the second ILD layer 702. Thereafter, a planarization and/or etch back is performed into the deposition until upper surfaces of the second ILD layer 702 and/or the deposition are coplanar. The planarization may, for example, be performed by a CMP.

Also illustrated, by the cross-sectional view 900B of FIG. 9B, a second conductive layer 902b is formed over the second ILD layer 702 and the via features 230. The second conductive layer 902b may be formed by, for example, depositing a conductive material, such as, for example, copper. The deposition may, for example, be performed using vapor deposition.

Figure 10:
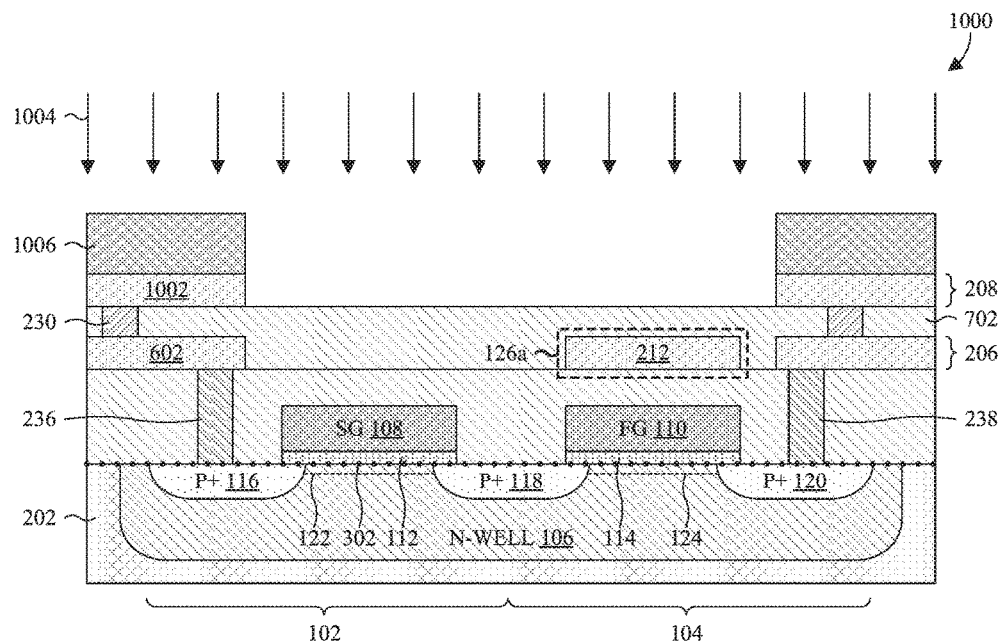

As illustrated by the cross-sectional view 1000 of FIG. 10, a second conductive layer is patterned to form a second interconnect layer 208. The second conductive layer may be, for example, the second conductive layer 902a of FIG. 9A for a dual-damascene-like process and/or the second conductive layer 902b of FIG. 9B for a single-damascene-like process. The second interconnect layer 208 comprises a plurality of features 1002 (only one of which is labeled), such as line features. The features 1002 of the second interconnect layer 208 electrically couple with features 602 of the first interconnect layer 206 through the via features 230.

In some embodiments, the process for forming the second interconnect layer 208 comprises depositing and patterning a photoresist layer over the second conductive layer. For example, the photoresist layer may be patterned to mask regions of the second conductive layer corresponding to the features 1002 of the second interconnect layer 208. Thereafter, one or more etchants 1004, such as wet or dry etchants, are applied to the second conductive layer while using the patterned photoresist layer 1006 as a mask. After patterning the second conductive layer, the patterned photoresist layer 1006 is removed.

Figure 11:
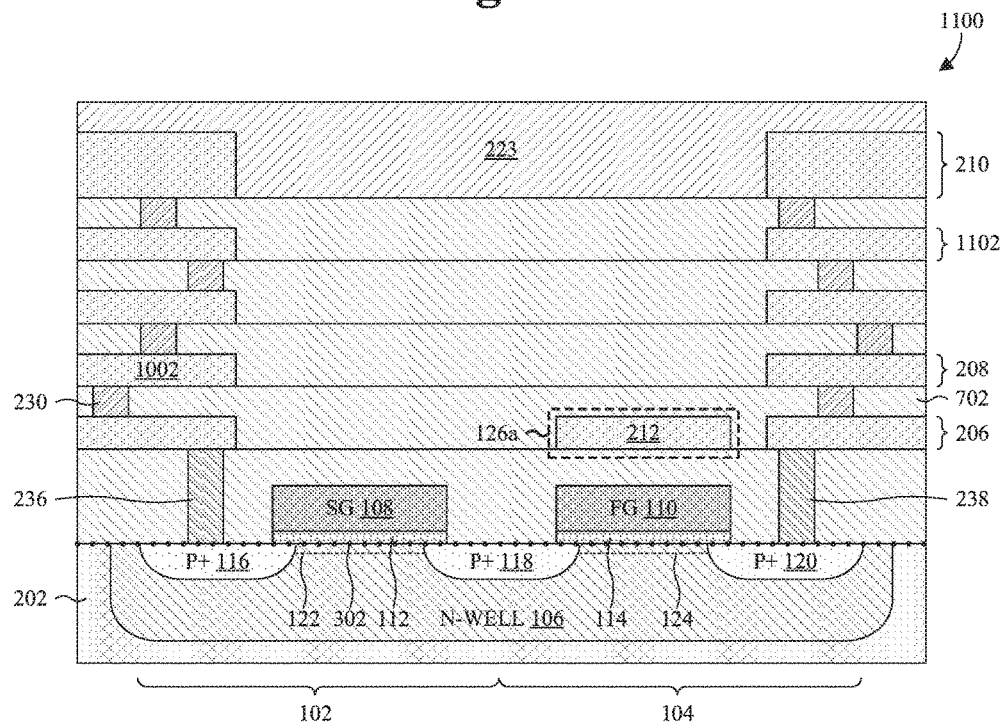

As illustrated by the cross-sectional view 1100 of FIG. 11, the processes of FIGS. 7, 8, 9A, 9B, and 10 are repeated for additional interconnect layers 210, 1102 (only some of which are labeled). For example, for each additional interconnect layer 210, 1102, an ILD layer is formed with a planar upper surface (see, e.g., FIG. 7). Via openings are formed (see, e.g., FIG. 8) in the ILD layer and filled (see, e.g., FIGS. 9A and 9B) in accordance with a single- or dual-damascene-like process. Further, an interconnect layer is formed over the ILD layer (see, e.g., FIG. 10).

Also illustrated by the cross-sectional view 1100 of FIG. 11, a passivation layer 223 is formed covering a topmost interconnect layer 210. In some embodiments, the process for forming the passivation layer 223 comprises depositing a dielectric material over the topmost interconnect layer 210. The dielectric material may, for example, be deposited by vapor deposition. Thereafter, a planarization, such as, for example, a CMP, is performed into the deposition to planarize an upper surface of the deposition.

Figure 12:
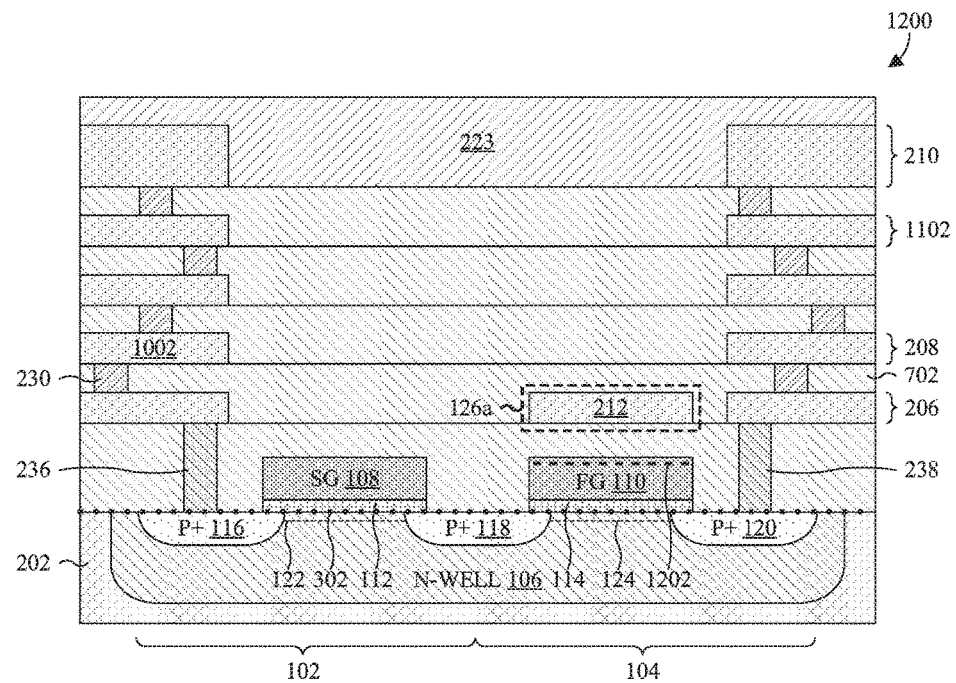

As illustrated by the cross-sectional view 1200 of FIG. 12, the OTP memory cell is programmed so the floating gate 110 comprises sufficient charge 1202 to enable the channel region 124 of the storage transistor 104 to conduct. In some embodiments, the OTP memory cell is programmed by applying a voltage across the select and storage transistors 102, 104 (e.g., between source/drain regions 116, 120 that are individual to the select and storage transistors 102, 104), while the select gate 108 is biased to allow the channel region 122 of the select transistor 102 to conduct. Carriers move within the channel region 122 of the select transistor 102 to the channel region 124 of the storage transistor 104, where the carriers undergo hot-carrier injection from the channel region 124 of the storage transistor 104 to the floating gate 110. The carriers then become trapped in the floating gate 110 to program the OTP memory cell.

Figure 13:
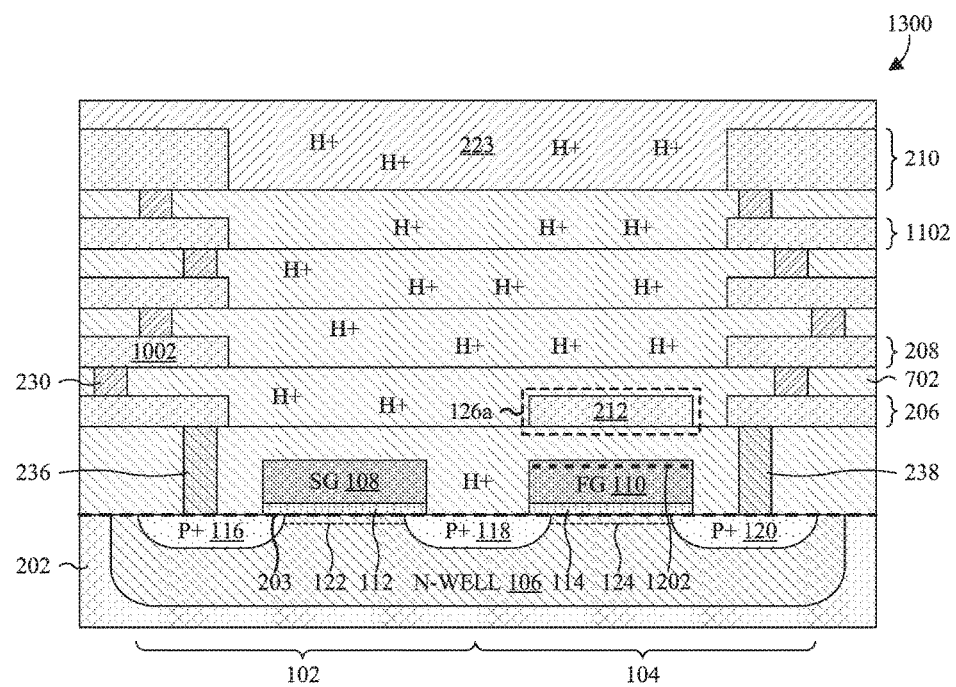

As illustrated by the cross-sectional view 1300 of FIG. 13, a hydrogen alloy process is performed to terminate dangling bonds 302 (see, e.g., FIG. 10 or 11) on an upper surface of the body region(s) 106 and/or the semiconductor substrate 202. The dangling bonds 302 may exist in the original semiconductor substrate 202 and/or may be caused by the previously performed processes. The hydrogen alloy process comprises annealing the OTP memory cell in a hydrogen-containing environment, which may include, for example, hydrogen gas ($H_2$). In some embodiments, the hydrogen alloy process may be performed at a temperature of about 400-460 degrees Celsius and/or for a duration of about 15-90 minutes. The hydrogen alloy process introduces hydrogen ions H+ into the body region(s) 106 and/or the semiconductor substrate 202, which terminate at least some of the dangling bonds 302. The terminated dangling bonds 203 advantageously reduce device mismatch (i.e., performance variation) when bulk manufacturing OTP memory cell.

Also illustrated by the cross-sectional view 1200 of FIG. 12, the shield 126a protects the floating gate from the hydrogen ions H+ so the charge 1202 stored in the floating gate 110 is not neutralized by the hydrogen ions H+. This advantageously allows the OTP memory cell to have good data retention and reliability, while also having reduced device mismatch.

While the foregoing process was described for a shield according to the embodiments of FIG. 2A, it is to be appreciated that the foregoing process can be modified for other embodiments of the shield. For example, the masks used to form the interconnect layers and/or the via openings may be adjusted to form other embodiments of the shield, such that no additional processes and/or costs are introduced. These other embodiments may span multiple via and/or interconnect layers, and/or may include multiple features. Even more, while the layout design of the OTP memory cell is beyond the scope of the present application, it is to be appreciated that the shield may be designed manually and/or by Boolean (i.e., logic) operations. As to the latter, for example, the features of multiple layers may be combined by Boolean operations (e.g., AND and OR) to cover the floating gate 110.

Figure 14:
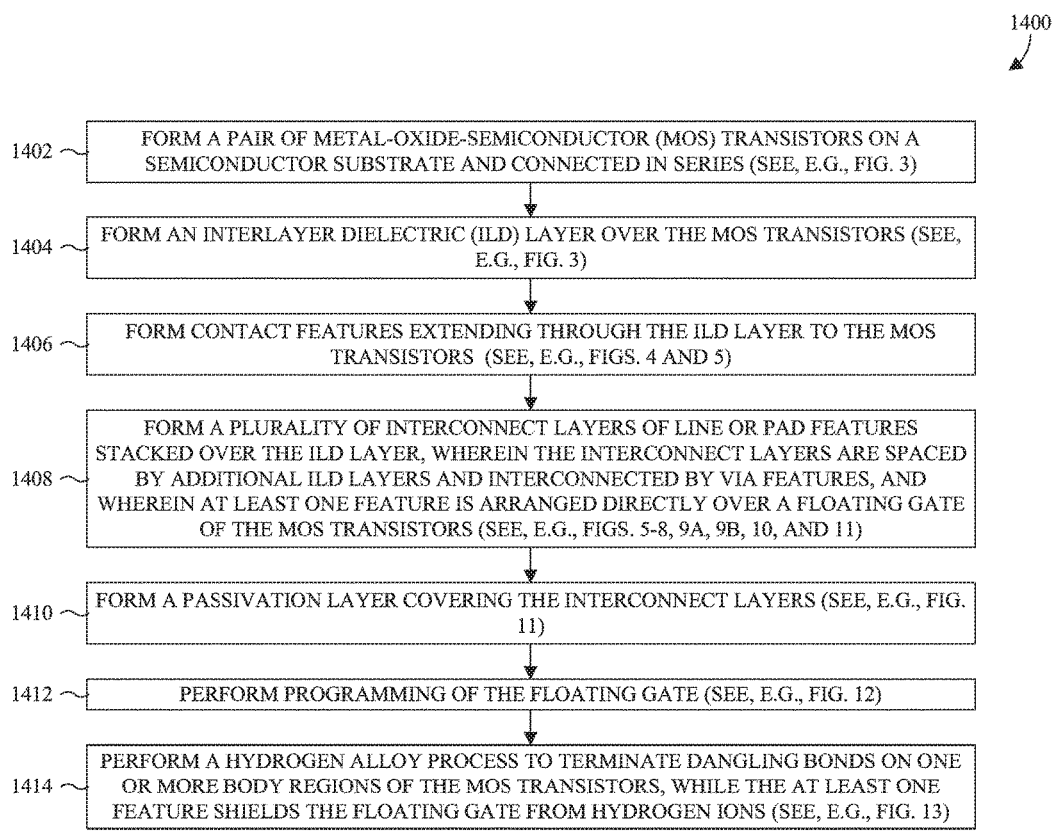
FIG. 14 illustrates a flowchart of some embodiments of a method for manufacturing an OTP memory cell with floating gate shielding.

With reference to FIG. 14, a flow chart 1400 of some embodiments of a method for manufacturing an OTP memory cell with floating gate shielding is provided.

At 1402, a pair of MOS transistors is formed on a semiconductor substrate and connected in series. See, e.g., FIG. 3.

At 1404, an ILD layer is formed over the MOS transistors. See, e.g., FIG. 3.

At 1406, contact features extending through the ILD layer to the MOS transistors are formed. See, e.g., FIGS. 4 and 5.

At 1408, a plurality of interconnect layers of line or pad features are formed stacked over the ILD layer. Forming the interconnect layers includes forming additional ILD layers spacing the interconnect layers and forming via features interconnecting the interconnect layers. Further, forming the interconnect layers includes forming at least one feature (e.g., a via feature, a pad feature, a line feature, etc.) directly over a floating gate of the MOS transistors. See, e.g., FIGS. 5-8, 9a, 9b, 10, and 11.

At 1410, a passivation layer is formed covering the interconnect layers. See, e.g., FIG. 11.

At 1412, in some embodiments, programming of the floating gate is performed. See, e.g., FIG. 12.

At 1414, in some embodiments, a hydrogen alloy process is performed to terminate dangling bonds on one or more body regions of the MOS transistors, while the at least one feature shields the floating gate from hydrogen ions. See, e.g., FIG. 13.

While the method described by the flowchart 1400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, as can be appreciated from above, the present disclosure provides a memory cell with floating gate shielding. A pair of transistors are arranged on a semiconductor substrate and electrically coupled in series. The transistors comprise a floating gate. An interconnect structure overlies the pair of transistors. A shield is arranged in the interconnect structure, directly over the floating gate. The shield is configured to block ions in the interconnect structure from moving to the floating gate.

In other embodiments, the present disclosure provides a method for manufacturing a memory cell with floating gate shielding. A pair of transistors are formed on a semiconductor substrate and electrically coupled in series. Forming the transistors comprises forming a floating gate. An interconnect structure is formed over the transistors. Forming the interconnect structure comprises forming layers of conductive features stacked upon one another. Further, forming the interconnect structure comprises forming at least one of the conductive features directly over the floating gate to define a shield.

In yet other embodiments, the present disclosure provides a memory cell with floating gate shielding. A pair of transistors is arranged on a semiconductor substrate and electrically coupled in series. The transistors comprise a floating gate configured to store a bit of data. An interconnect structure overlies the transistors. The interconnect structure comprises interconnect layers of line features stacked upon one another, and further comprises via layers of via features interconnecting the line features between the interconnect layers. A shield comprises a feature of the interconnect or via layers that is arranged directly over the floating gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell with floating gate shielding, comprising:
   a pair of transistors arranged on a semiconductor substrate and electrically coupled in series, wherein the transistors comprise a floating gate and a source/drain region bordering the floating gate;
   an interconnect structure overlying the pair of transistors, wherein the interconnect structure comprises a conductive line and a conductive via, wherein the conductive via is under the conductive line, and wherein the conductive via extends continuously from contact with the source/drain region to contact with the conductive line; and
   a shield arranged directly over the floating gate, in the interconnect structure, wherein the shield is configured to block ions in the interconnect structure from moving to the floating gate, wherein the shield is over an interface at which the conductive via contacts the conductive line, and wherein the shield is spaced over and electrically isolated from the floating gate.

2. The memory cell according to claim 1, wherein the interconnect structure comprises interconnect layers of line features stacked upon one another, and further comprises via layers of via features interconnecting the line features between the interconnect layers.

3. The memory cell according to claim 2, wherein the shield comprises one of the line features that directly overlies the floating gate.

4. The memory cell according to claim 2, wherein the shield comprises one of the via features that directly overlies the floating gate.

5. The memory cell according to claim 2, wherein the floating gate is continuous, and wherein the shield comprises:
   a first line feature of the interconnect layers that individually covers a first subset of the floating gate at a first height above the floating gate; and
   a second line feature of the interconnect layer that individually covers a second subset of the floating gate at a second height above the floating gate, wherein the first and second heights are different, and wherein the first and second subsets are different.

6. The memory cell according to claim 5, wherein the first and second line features collectively cover about 100% of the floating gate.

7. The memory cell according to claim 2, wherein the shield comprises:
   a line feature of the interconnect layers arranged directly over the floating gate; and
   a via feature of the via layers arranged directly over the floating gate.

8. The memory cell according to claim 2, wherein the interconnect or via layers are limited to a periphery of the memory cell, except for a portion for the interconnect or via layers making up the shield, when the interconnect structure is viewed in profile, and wherein each of the via layers extends from contact with an underlying one of the interconnect layers to contact with an overlying one of the interconnect layers.

9. The memory cell according to claim 2, wherein the interconnect and via layers are limited to a periphery of the memory cell, except for a portion for the interconnect and via layers making up the shield, when the interconnect structure is viewed in profile.

10. The memory cell according to claim 1, wherein a footprint size of the shield is less than or equal to that of the floating gate.

11. The memory cell according to claim 1, wherein the shield comprises a plurality of conductive features of the interconnect structure that individually cover at least a portion of the floating gate, and wherein the conductive features are distributed amongst a plurality of heights above the floating gate.

12. The memory cell according to claim 1, wherein an upper surface of the semiconductor substrate comprises dangling bonds terminated by hydrogen ions.

13. The memory cell according to claim 1, wherein the transistors comprise a select gate laterally spaced over the semiconductor substrate from the floating gate, wherein the transistors share a common source/drain region arranged between the select and floating gate, and wherein the transistors comprise individual source/drain regions on opposite sides of the select and floating gates as the common source/drain region.

14. A memory cell with floating gate shielding, comprising:
 a pair of transistors arranged on a semiconductor substrate and electrically coupled in series, wherein the transistors comprise a floating gate configured to store a bit of data;
 an interconnect structure overlying the transistors, wherein the interconnect structure comprises interconnect layers of line features stacked upon one another, and further comprises via layers of via features interconnecting the line features between the interconnect layers;
 a shield arranged directly over the floating gate and comprising a feature of the interconnect or via layers; and
 a diffusion path for hydrogen ions extending from a top surface of the interconnect structure to the shield, wherein the diffusion path is line shaped and substantially orthogonal to a top surface of the floating gate, and wherein the shield is configured to block hydrogen diffusing along the diffusion path from reaching the floating gate.

15. The memory cell according to claim 14, wherein the shield comprises a plurality of via features distributed amongst several of the via layers, and wherein the via features of the plurality each partially covers the floating gates.

16. The memory cell according to claim 14, wherein the interconnect structure further comprises an interlayer dielectric (ILD) layer within which the interconnect layers and the via layers are stacked, wherein the shield comprises a line feature of the interconnect layers and a via feature of the via layers, and wherein the via feature extends from contact with the line feature to contact with the ILD layer at a horizontal surface of the via feature.

17. The memory cell according to claim 14, wherein the transistors further comprise a select gate adjacent to the floating gate, and wherein the memory cell further comprises:
 a second diffusion path for hydrogen ions extending in parallel with the diffusion path, from the top surface of the interconnect structure to the select gate, wherein the second diffusion path is line shaped and unimpeded by the interconnect layers and the via layers.

18. The memory cell according to claim 14, where the semiconductor substrate comprises dangling bonds terminated by hydrogen, and wherein the shield comprises hydrogen absorbed from a surrounding environment.

19. The memory cell according to claim 14, wherein the transistors comprise a source/drain region bordering the floating gate, wherein the interconnect layers comprise a first wiring layer spaced over the floating gate, wherein the via layers comprise a first via layer extending from contact with the first via layer to contact with the source/drain region, and wherein the shield comprises a line feature that is in the first wiring layer and that is directly over the floating gate.

20. A one-time programmable memory cell comprising:
 a semiconductor substrate comprising a first source/drain region, a second source/drain region, and a third source/drain region, wherein the second source/drain region is between the first and second source/drain regions, and wherein dangling bonds along a top surface of the semiconductor substrate are terminated by hydrogen;
 a select transistor comprising the first and second source/drain regions, and further comprising a select gate electrode, wherein the select gate electrode is over the semiconductor substrate, and wherein the select gate electrode is between and borders the first and second source/drain regions;
 a floating transistor comprising the second and third source/drain regions, and further comprising a floating gate electrode, wherein the floating gate electrode is over the semiconductor substrate, and wherein the floating gate electrode is between and borders the second and third source/drain regions;
 an interconnect structure covering the semiconductor substrate, the select transistor, and the floating transistor, wherein the interconnect structure comprises an ILD layer, a plurality of via layers, and a plurality of interconnect layers, and wherein the interconnect layers are alternatingly stacked with the via layers in the ILD layer; and
 a shield covering the floating gate electrode and comprising conductive features of the via layers and the interconnect layers, wherein the interconnect and via layers are limited to a periphery of the one-time programmable memory cell, except for a portion for the interconnect and via layers making up the shield, when the interconnect structure is viewed in profile.

* * * * *